United States Patent
Wang et al.

(10) Patent No.: US 6,614,060 B1
(45) Date of Patent: Sep. 2, 2003

(54) LIGHT EMITTING DIODES WITH ASYMMETRIC RESONANCE TUNNELLING

(75) Inventors: Wang Nang Wang, Bath (GB); Yurii Georgievich Shreter, St. Petersburg (RU); Yurii Toomasovich Rebane, St. Petersburg (RU)

(73) Assignee: Arima Optoelectronics Corporation, Taipei (TW)

( * ) Notice: Subject to any disclaimer, the term of this patent is extended or adjusted under 35 U.S.C. 154(b) by 0 days.

(21) Appl. No.: 09/579,773

(22) Filed: May 26, 2000

(30) Foreign Application Priority Data

May 28, 1999 (GB) .............................................. 9912583

(51) Int. Cl.[7] ..................... H01L 29/24; H01L 31/0304; H01L 29/205
(52) U.S. Cl. ........................... 257/103; 257/25; 257/14; 257/94; 257/96; 257/97
(58) Field of Search .............................. 257/14, 18, 22, 257/25, 94, 96, 97, 101, 102, 103

(56) References Cited

U.S. PATENT DOCUMENTS

| | | | | |
|---|---|---|---|---|
| 5,569,934 A | * | 10/1996 | Fujii et al. ..................... 257/21 |
| 5,588,015 A | * | 12/1996 | Yang ............................. 372/45 |
| 5,661,741 A | * | 8/1997 | Kakimoto ....................... 372/46 |
| 5,679,152 A | * | 10/1997 | Tischler et al. ................ 117/97 |
| 5,741,724 A | * | 4/1998 | Ramdani et al. .............. 437/128 |
| 5,744,829 A | * | 4/1998 | Murasato et al. .............. 257/94 |

FOREIGN PATENT DOCUMENTS

| | | | | |
|---|---|---|---|---|
| EP | 0254568 A2 | * | 1/1988 | |
| EP | 0 254 568 | | 1/1988 | ............. H01S/3/08 |
| EP | 0549853 A1 | * | 7/1993 | |
| EP | 0 549 853 | | 7/1993 | ........... H01S/3/103 |
| EP | 0690515 A1 | * | 1/1996 | |
| EP | 0 690 515 | | 1/1996 | ....... H01L/31/0203 |
| EP | 0 690 516 | | 1/1996 | ........... H01L/33/00 |
| EP | 0 721 241 | | 7/1996 | ............. H01S/3/19 |
| EP | 0721241 A3 | * | 1/1997 | |
| JP | 08064791 A | * | 3/1996 | |
| JP | 0410125956 A | * | 10/1996 | |
| WO | WO-9219017 | * | 10/1992 | |

OTHER PUBLICATIONS

Rebane et al., "Light Emitting Diode with Charge Asymmetric Resonance Tunneling", Physica Status Solidi (a), vol. 180, No. 1, 2000, pp. 121–126.

Search Report relating to corresponding United Kingdom application No. GB 9912583.3 dated Aug. 18, 1999, 1 p.

* cited by examiner

*Primary Examiner*—Nathan J. Flynn
*Assistant Examiner*—Johannes Mondt
(74) *Attorney, Agent, or Firm*—Christie, Parker & Hale, LLP

(57) ABSTRACT

An LED based on a two well system with charge asymmetric resonance tunnelling comprises first and second coupled wells, one being a wide well and the other an active quantum well. The wells are coupled via a resonance tunnelling barrier which is transparent for electrons and blocking for holes.

8 Claims, 4 Drawing Sheets

LIGHT EMITTING DIODES WITH ASYMMETRIC RESONANCE TUNNELLING

This invention relates to light emitting diodes (LEDs).

Semiconductor LEDs emitting red, green, blue, infrared and ultraviolet light have been marketed for many years. For light generation in LEDs, radiative recombination of electrons and holes in an active layer is used. The active layer can be a usual p-n junction, heterojunction, single quantum well or multiple quantum wells. In some LEDs, a single quantum well or multiple quantum wells is or are used as the active layer. For fabrication of a highly efficient device, the number of carriers recombined inside the active layer should be maximized and the number of carriers recombined outside the active layer should be minimized. This needs optimization of capture rates for electrons and holes into the active layer. Usually in semiconductors, effective masses of holes are much higher and mobilities much less than those for electrons. Therefore, some of the electrons not captured in the active layer escape the active layer and recombine outside it. This prevents fabrication of highly efficient LED devices.

This invention provides an LED design based on a two well system with asynnnetric tunnelling, the system comprising first and second coupled wells, namely a wide well (WW) and an active quantum well (QW), the wells being coupled via a resonance tunnelling barrier (RTB) transparent for electrons and blocking for holes. Both the wide well and the active quantum well can be made of either a single quantum well (SQW) structure or a multiple quantum well (MQW) structure.

This invention allows enhancement of the number of electrons captured in the active layer with the quantum well and the fabrication of highly efficient LEDs.

The LED could be a GaN LED, a GaAs LED, an AlGaInP or a ZnSe LED for example. More generally, the LED could be one which is based on a III–V or II–VI group semiconductor.

A p-layer could be one of GaN, p-$Al_{1-x}N$ and p-type polycrystalline Gan example. More generally, the LED could be one which is based on a III–V or II–VI group semiconductor.

A substrate of the LED could be removable or have been removed by wet etching or laser ablation.

Ohmic contacts could be on the top and bottom or both on the top of the LED structure.

Resonance tunnelling between two wells means that the energy position of the WW bottom has to be equal to the energy position of the sub-band minimum of the active QW. This problem may be solved by adjusting the alloy composition in the WW and the QW, and choosing a proper QW width.

This design is based on the mass asymmetry of electrons and holes in GaN for example.

It allows the electron sub-band position in the active QW to be fitted to the bottom of the WW and at the same time the hole sub-band minimum in the QW to be kept lower than the bottom of the WW for holes and thus forbids hole penetration without thermal activation in the WW. It is important that even the small amount of thermally activated holes have no possibility to tunnel into the WW for the chosen barrier width because of their heavy mass.

Advantages

The structures to be described allow:

- an increase of the capture efficiency of electrons into the active QW due to direct tunnelling of electrons from the WW into the QW
- suppression of electron leakage into the p-type layer
- elimination of parasitic light generated outside the active layer
- the use of the WW as a good current spreading layer means an improvement of the quality of the active QW because of mismatch reduction (~4 times). The reason is that active $In_{0.2}Ga_{0.8}N$ (for example) QW growth on a highly tensile strained thin GaN barrier has a lattice parameter close that of an $In_{0.15}Ga_{0.85}N$ (for example) WW
- the WW also works as a stopping layer for threading dislocations, because of the high stress on an interface of n-GaN/$In_{0.15}Ga_{0.85}N$ (for example)
- there is no need to use electron blocking layers as an element in this technology
- reduction of the growth time, since we expect that the same quality of the active QW will be achieved for a thinner n-GaN layer for example in a GaN LED.

Finally, the structures should allow the manufacture of cheaper and more efficient LEDs than conventional ones.

This invention will now be described, by way of example, with reference to the accompanying drawings, in which:

FIGS. 1, 3, 5, 7, 8 and 9 show examples of structures according to this invention; and FIGS. 2, 4 and 6 are simplified energy band diagrams of the structures of FIGS. 1, 3 and 5 respectively.

FIG. 1 shows a first structure, which is a GaN blue LED design based on a two well system with asymmetric tunnelling. The system comprises two coupled wells: a wide well (WW) and an active quantum well (QV). The wells are coupled via a resonance tunnelling barrier (RTB) transparent for electrons and blocking for holes. Table 1 lists parameters for a blue LED based on the first structure. Table 2 lists parameters for a green LED based on the first structure.

TABLE 1

| # | Layer | Composition | Thickness | Doping (cm$^{-3}$) |
|---|---|---|---|---|
| 1 | Buffer Layer | GaN or AlGaN/GaN strained superlattice | 50–500 Å | UD (undoped) |
| 2 | n-contact | GaN:Si | 1–5 μm | 5 × $10^{18}$–$10^{20}$ |
| 3 | WW | InGaN (In content 15%) | 500 Å | UD or n-type |
| 4 | RTB | GaN | 10 Å | UD |
| 5 | Active QW | InGaN (In content 20%) | 25 Å | UD |
| 6 | p-contact | GaN:Mg or GaN:Mg + Al | 0.5 μm | ~$10^{18}$ |

TABLE 2

| # | Layer | Composition | Thickness | Doping (cm$^{-3}$) |
|---|---|---|---|---|
| 1 | Buffer Layer | GaN or AlGaN/GaN strained superlattice | 50–500 Å | UD (undoped) |
| 2 | n-contact | GaN:Si | 3–5 μm | 5 × $10^{18}$–$10^{20}$ |
| 3 | Electron injection well | InGaN (In content 28%) | 500 Å | UD or n-type |
| 4 | RTB | GaN | 8 Å | UD |
| 5 | Active well | InGaN (In content 40%) | 15 Å | UD |
| 6 | p-contact | GaN:Mg or GaN:Mg + Al | 0.5 μm | ~$10^{18}$ |

The p-$Al_xGa_{1-x}N$ electron blocking layer serves serves as a contact. This will reduce the thickness of the p-type layer and improve hole injection into the active layer and light extraction through wide-band gap windows.

Figure 1:
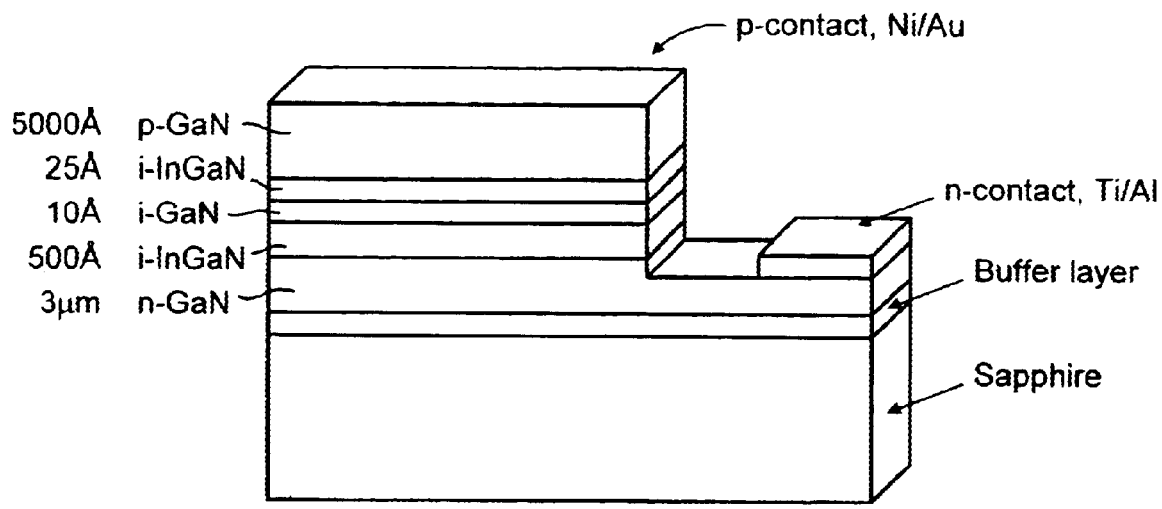
Figure 2:
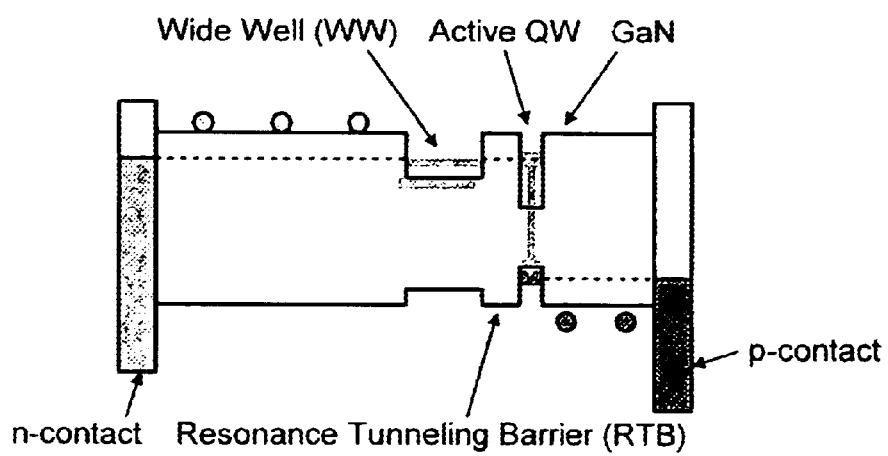
Figure 3:
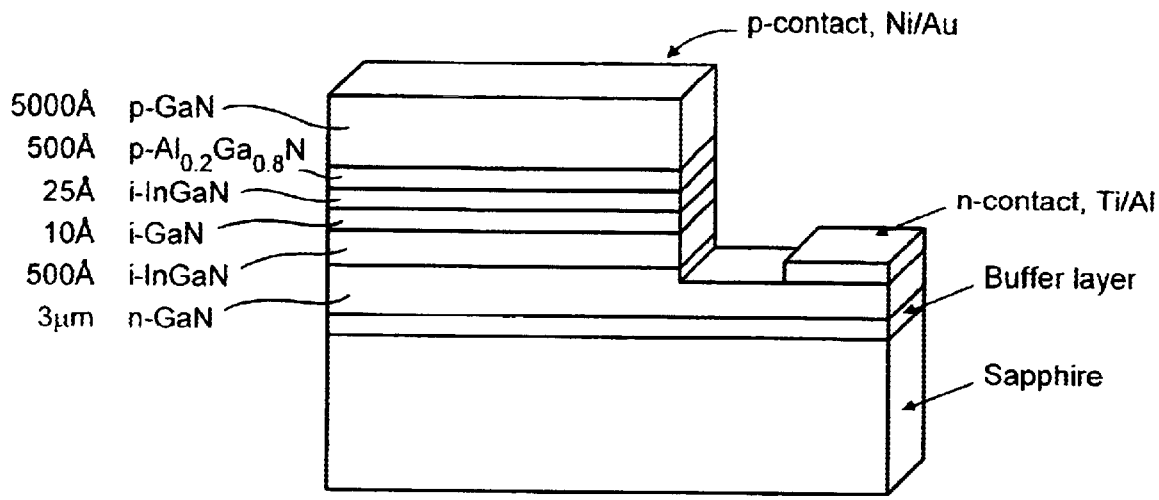
FIG. 3 shows a second structure which is similar to the first but with an extra p-$Al_xGa_{1-x}N$ electron blocking layer for further reduction of the electron current leakage.
Figure 4:
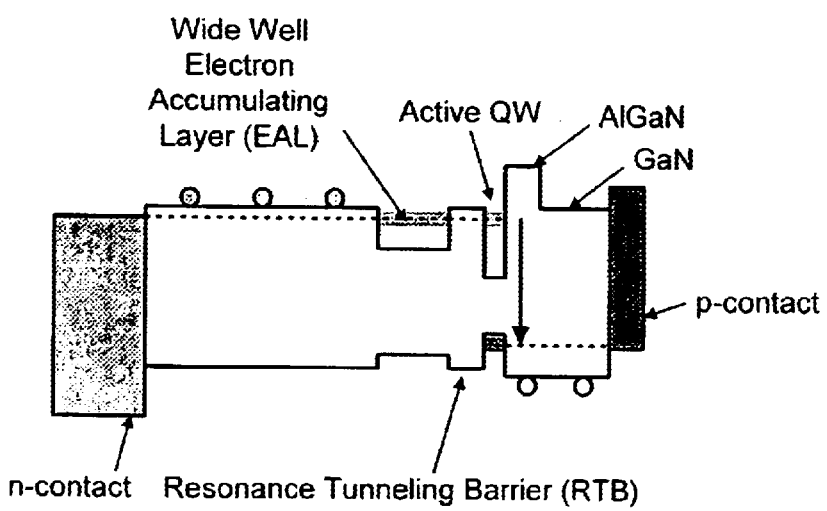
Figure 5:
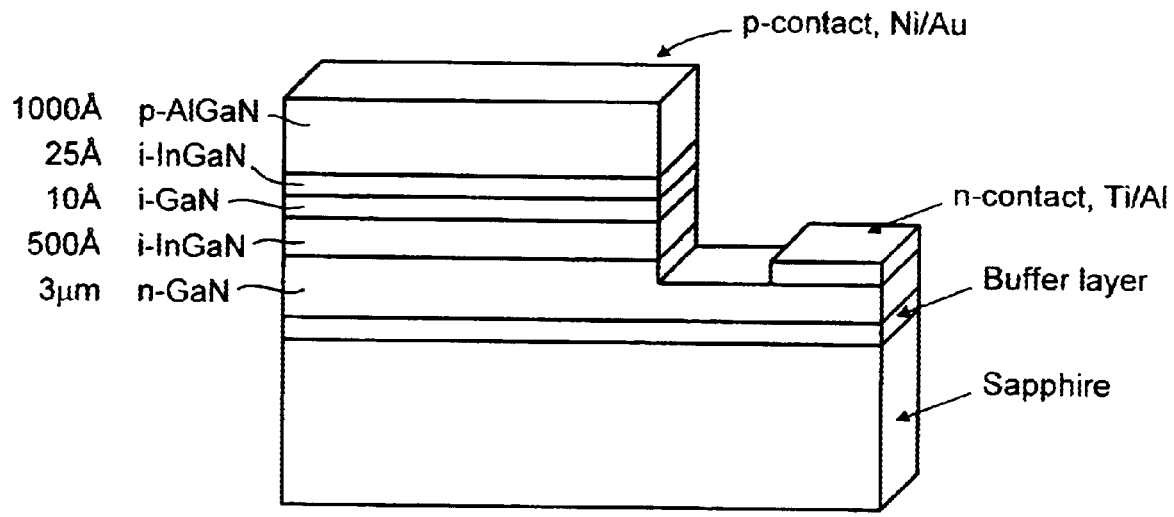
FIG. 5 shows a third structure which is similar to the second but without the p-GaN layer.
Figure 6:
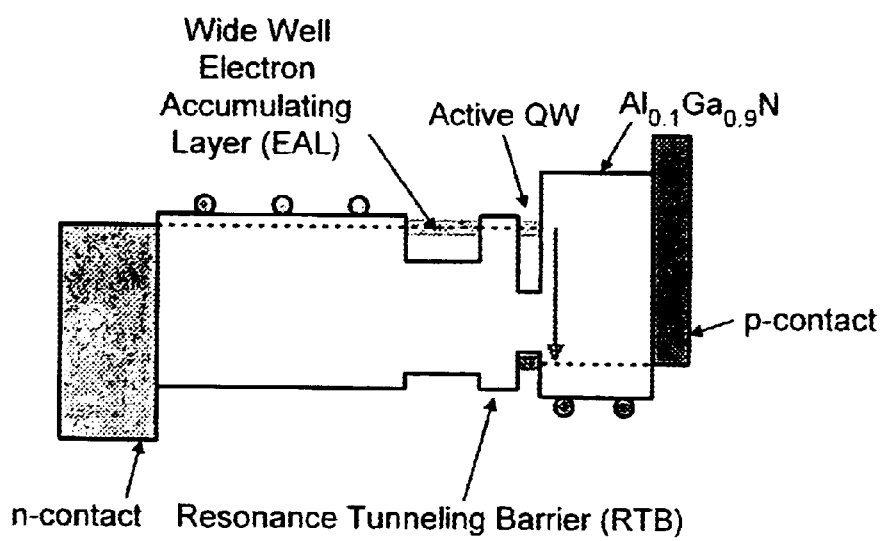
Figure 7:
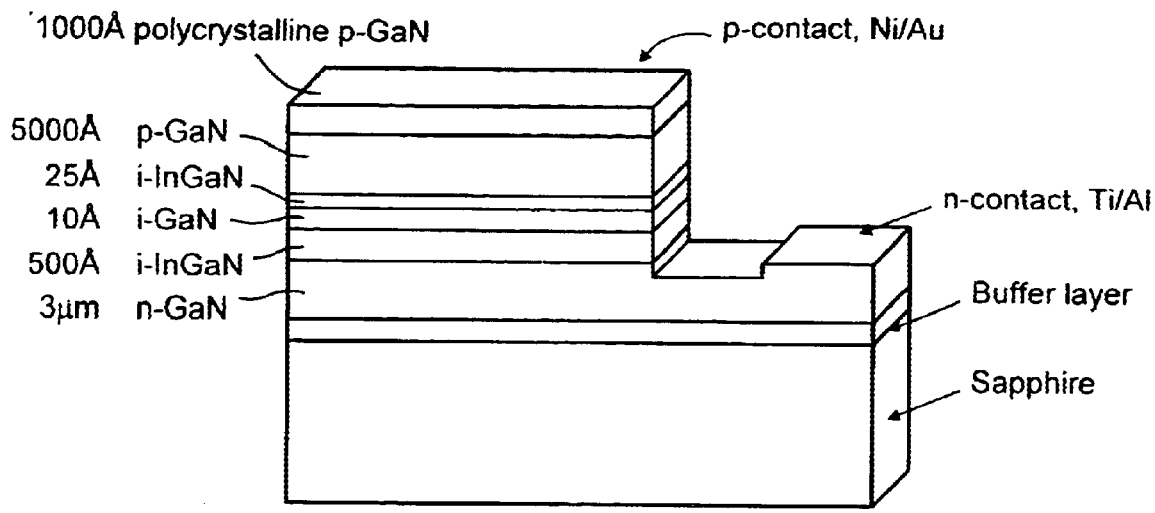

FIG. 7 shows a fourth structure which is similar to the first, second and third, except an extra polycrystalline GaN layer is deposited to make an efficient p-type ohmic contact.

The illustrated structure is a modified version of the first structure with the extra polycrystalline GaN layer.

Figure 8:
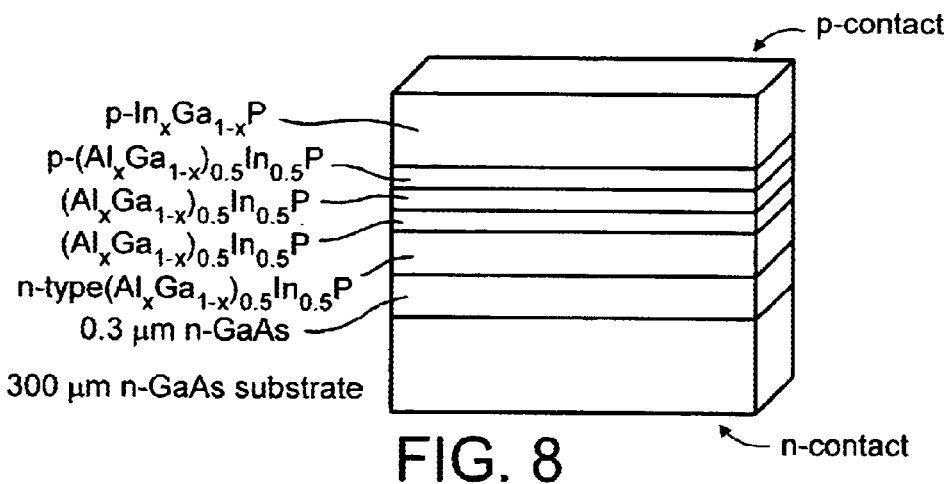

FIG. 8 shows an AlGaInP based LED based on a two well system with charge asymmetric resonance tunnelling. It has an n-type GaAs substrate with a thickness of 100–300 $\mu$m and an attached metallic contact. Upon the substrate an n-type GaAs buffer layer is deposited. An n-cladding layer is deposited on top of the buffer layer and is made of 0.3 to 2 $\mu$m thick n-type $(Al_xGa_{1-x})_{0.5}In_{0.5}P$ with $0.5 \leq x \leq 1$ and a doping level of $5\times10^{17}$–$10^{20}$ cm$^{-3}$. On this layer an electron emitting wide well is epitaxially grown which is formed of a simple undoped layer or a multiple quantum well structure. An undoped electron emitting layer can be made of 0.01 to 0.2 $\mu$m thick $(Al_xGa_{1-x})_{0.5}In_{0.5}P$ with $0.2 \leq x \leq 0.5$. A multiple quantum well structure can be made of $\leq 1$ $\mu$m thick $(Al_xGa_{1-x})_{1-y}In_yP/(Al_{x1}Ga_{1-x1})_{1-y1}In_{y1}P$ with $0.5 \leq x \leq 1$, $0.4 \leq y \leq 0.6$ and $0 \leq x1 \leq 0.4$, $0 \leq y1 \leq 0.4$. Then the charge asymmetric resonance tunnelling barrier is epitaxially deposited, which is made of an ~10–100 Å thick undoped $(Al_xGa_{1-x})_{0.5}In_{0.5}P$ layer with $0.7 \leq x \leq 1$. The barrier width and height are optimized in such way in order to allow resonant tunnelling of the electrons from the electron injecting wide well layer into the active well and at the same time to block the hole tunnelling from the active well into the electron injecting layer. The active well layer can be either a single quantum well (SQW) structure or multiple quantum well (MQW) structure. An SQW structure can be made of <200 Å thick undoped $(Al_xGa_{1-x})_{0.5}In_{0.5}P$ with $0 \leq x \leq 0.4$. An MQW structure can be made of $\leq 3$ $\mu$m thick $(Al_xGa_{1-x})_{1-y}In_yP/(Al_{x1}Ga_{1-x1})_{1-y1}In_{y1}P$ with $0.5 \leq x \leq 1$, $0.4 \leq y \leq 0.6$ and $0 \leq x1$ 0.4, $0 \leq y1 \leq 0.4$. The hole emitting layer is made of 0.3–2 $\mu$m thick p-type $(Al_xGa_{1-x})_{0.5}In_{0.5}P$ with $0.5 \leq x \leq 1$ and a doping level of $5\times10^{16}$ to $5\times10^{18}$ cm$^{-3}$. The window layer is made of p-type $In_xGa_{1-x}P$ with $x \leq 0.1$, a thickness $\leq 12$ $\mu$m and a doping level of $5\times10^{17}$ to $5\times10^{18}$ cm$^{-3}$. On the hole emitting layer a metallic ohmic contact is deposited. Table 3 lists parameters for such an AlInGaP LED based on the charge asymmetric resonance tunnelling structure.

TABLE 3

| # | Layer | Composition | Thickness | Doping (cm$^{-3}$) |
|---|---|---|---|---|
| 1 | Buffer Layer | n-GaAs | 0.1~0.3 $\mu$m | $5 \times 10^{17}$–$10^{19}$ |
| 2 | n-contact | $(Al_xGa_{1-x})_{0.5}In_{0.5}P$ $0.5 \leq x \leq 1$ | 0.3~2 $\mu$m | $5 \times 10^{17}$–$10^{20}$ |
| 3 | WW | $(Al_xGa_{1-x})_{0.5}In_{0.5}P$ $0.2 \leq x \leq 0.5$ | 100~2000 Å | UD or n-type |
| 4 | RTB | $(Al_xGa_{1-x})_{0.5}In_{0.5}P$ $0.7 \leq x \leq 1$ | 10~100 Å | UD |
| 5 | Active QW | $(Al_xGa_{1-x})_{0.5}In_{0.5}P$ SQW or MQW | SQW 25~100 Å MQW 0.2~1 $\mu$m | UD |
| 6 | p-Contact | $(Al_xGa_{1-x})_{0.5}In_{0.5}P$ $0.5 \leq x \leq 1$ | 0.5~2 $\mu$m | $5 \times 10^{16}$–$10^{18}$ |

TABLE 3-continued

| # | Layer | Composition | Thickness | Doping (cm$^{-3}$) |
|---|---|---|---|---|
| 7 | Window Layer | $In_xGa_{1-x}P$ $x \leq 0.1$ | 8~12 $\mu$m | $5 \times 10^{17}$–$5 \times 10^{18}$ |

Figure 9:
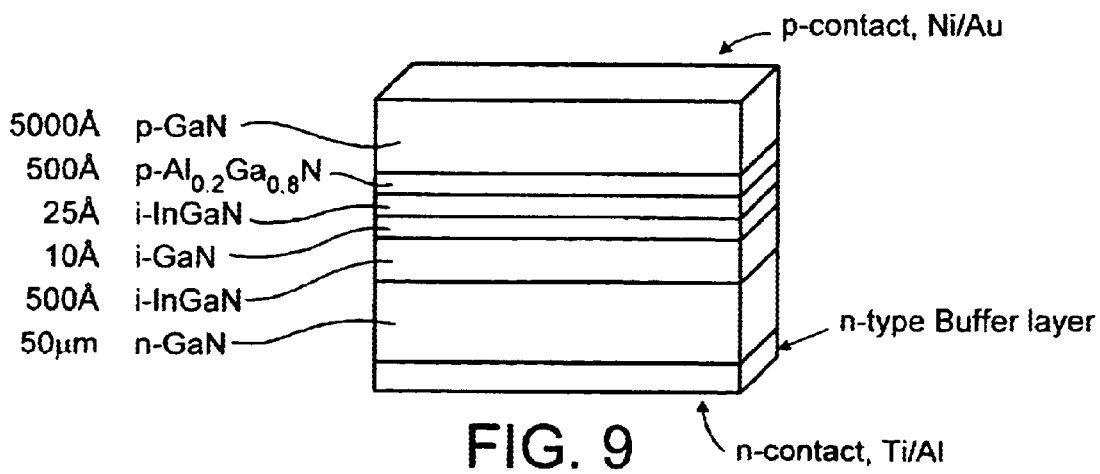

FIG. 9 shows a fifth structure which is similar to the first, second, third and fourth, except without the substrate and the ohmic contacts being on the top and bottom of the structure. The extra thick GaN layer is deposited on top of the GaN buffer layer to allow the structure to be free standing after the removal of the sapphire substrate by an excimer laser of 193 or 248 nm UV range.

What is claimed is:

1. A light emitting diode (LED) based on a two well system with charge asymmetric resonance tunnelling, comprising first and second coupled wells, one being an active quantum well and the other well being a well which is wide compared with the active quantum well, the wells being coupled via a resonance tunnelling barrier which is transparent for electrons and blocking for holes, wherein the wide well comprises InGaN, the resonance tunnelling barrier comprises GaN and the quantum well comprises InGaN.

2. An LED according to claim 1, wherein the active well is a multiple quantum well structure.

3. An LED according to claim 1, including a buffer layer comprising a strained superlattice.

4. An LED according to claim 1, wherein a p-contact layer is one of GaN, p-$Al_xGa_{1-x}N$ and p-type polycrystalline GaN.

5. An LED according to claim 1, wherein a p-contact layer has been doped by isoelectronic codoping using one or both of Mg and Al.

6. An LED according to claim 1, wherein ohmic contacts are either both on the top or on the top and bottom of the LED structure.

7. A light emitting diode (LED) based on a two well system with charge asymmetric resonance tunnelling, comprising first and second coupled wells, one being an active quantum well and the other well being a well which is wide compared with the active quantum well, the wells being coupled via a resonance tunnelling barrier which is transparent for electrons and blocking for holes, wherein the LED is an AlGaInP based LED comprising:

an n-type GaAs substrate with the thickness of 100–300 $\mu$m;

a metallic ohmic contact attached to the substrate;

an n-type GaAs buffer layer with a doping level of $5\times10^{17}$–$10^{19}$ cm$^{-3}$ and a thickness of 0.1 to 0.3 $\mu$m;

an n-cladding layer made of 0.3 to 2 $\mu$m thick n-type $(Al_xGa_{1-x})_{0.5}In_{0.5}P$ with $0.5 \leq x \leq 1$ and a doping level of $5\times10^{17}$–$10^{20}$ cm$^{-3}$;

an electron emitting layer comprising a simple undoped electron emitting layer made of 0.01 to 0.2 $\mu$m thick $(Al_xGa_{1-x})_{0.5}In0.5P$ with $0.2 \leq x$ 0.5 or a multiple quantum well structure made of $\leq 1$ $\mu$m thick $(Al_xGa_{1-x})_{1-y}In_yP/(Al_{x1}Ga_{1-x1})_{1-y1}In_{y1}P$ with $0.5 \leq x \leq 1$, $0.4 \leq y \leq 0.6$ and $0 \leq x1 \leq 0.4$, $0 \leq y1 \leq 0.4$;

a charge asymmetric resonance tunnelling barrier comprising an ~10–100 Å thick undoped $(Al_xGa_{1-x})_{0.5}In_{0.5}P$ layer with $0.7 \leq x \leq 1$;

an active well layer comprising either a single quantum well structure made of <200 Å thick undoped $(Al_xGa_{1-x})_{0.5}In_{0.5}P$ with $0 \leq x \leq 0.4$ or a multiple quantum well structure made of $\leq 3$ μm thick $(Al_xGa_{1-x})_{1-x}In_yP/(Al_{x1}Ga_{1-x1})_{1-y1}In_{y1}P$ with $0.5 \leq x \leq 1$, $0.4 \leq y \leq 0.6$ and $0 \leq x \leq 0.4$, $0 \leq y1\ 23\ 0.4$;

a 0.3 to 2 μm thick hole emitting layer made of p-type $(Al_xGa_{1-x})_{0.5}In_{0.5}P$ with $0.5 \leq x \leq 1$ and a doping level of $5 \times 10^{16}$ to $5 \times 10^{18}$ cm$^{-3}$; and a $\leq 12$ μm window layer made of p-type $In_xGa_{1-x}P$ with $x \leq 0.1$ and a doping level $5 \times 10^{17}$ to $5 \times 10^{18}$ cm$^{-3}$; and a metallic ohmic contact deposited on the hole emitting layer.

8. A light emitting diode (LED) based on a two well system with charge asymmetric resonance tunnelling, comprising first and second coupled wells, one being an active quantum well and the other well being a well which is wide compared with the active quantum well, the wells being coupled via a resonance tunnelling barrier which is transparent for electrons and blocking for holes, wherein the wide well comprises a III-nitride-based semiconductor, the resonance tunnelling barrier comprises a III-nitride-based semiconductor and the quantum well comprises a III-nitride-based semiconductor.

* * * * *